(12) United States Patent
Pendse

(10) Patent No.: US 8,212,352 B2
(45) Date of Patent: Jul. 3, 2012

(54) INTEGRATED CIRCUIT PACKAGE SYSTEM WITH HEAT SINK SPACER STRUCTURES

(75) Inventor: Rajendra D. Pendse, Fremont, CA (US)

(73) Assignee: Stats Chippac Ltd., Singapore (SG)

( * ) Notice: Subject to any disclaimer, the term of this patent is extended or adjusted under 35 U.S.C. 154(b) by 105 days.

(21) Appl. No.: 12/050,797

(22) Filed: Mar. 18, 2008

(65) Prior Publication Data

US 2008/0237817 A1    Oct. 2, 2008

Related U.S. Application Data

(60) Provisional application No. 60/908,669, filed on Mar. 28, 2007.

(51) Int. Cl.
*H01L 23/495* (2006.01)
(52) U.S. Cl. ............... 257/712; 257/675; 257/E23.031; 438/106
(58) Field of Classification Search .......... 257/712; 438/106
See application file for complete search history.

(56) References Cited

U.S. PATENT DOCUMENTS

| | | | |
|---|---|---|---|
| 6,653,167 B2 | 11/2003 | Gektin | |
| 6,933,176 B1 | 8/2005 | Kirloskar et al. | |
| 7,094,966 B2 | 8/2006 | Bonitz et al. | |
| 7,138,300 B2 | 11/2006 | Yuan et al. | |
| 7,298,623 B1 * | 11/2007 | Kuczynski et al. | 361/719 |
| 2004/0075990 A1 | 4/2004 | Bonitz et al. | |
| 2004/0119153 A1 * | 6/2004 | Karnezos | 257/686 |
| 2005/0224955 A1 * | 10/2005 | Desai et al. | 257/706 |
| 2006/0063300 A1 * | 3/2006 | Yuan et al. | 438/106 |
| 2006/0151867 A1 * | 7/2006 | Karnezos | 257/686 |
| 2006/0223229 A1 | 10/2006 | Kirloskar et al. | |

FOREIGN PATENT DOCUMENTS

| | | |
|---|---|---|
| CN | 1902751 A | 1/2007 |
| TW | 200709457 A | 3/2007 |

OTHER PUBLICATIONS

Office Action for Chinese application No. 200810086940.1 dated Dec. 7, 2010.
Second Office Action for CN Application No. 200810086940.1 dated May 17, 2011.
Third Office Action for CN Application No. 200810086940.1 dated Nov. 15, 2011.

* cited by examiner

*Primary Examiner* — Zandra Smith
*Assistant Examiner* — Lawrence Tynes, Jr.
(74) *Attorney, Agent, or Firm* — Ishimaru & Associates LLP; Mikio Ishimaru; Stanley Chang

(57) ABSTRACT

An integrated circuit package system comprising: providing a package substrate; attaching an integrated circuit die over the package substrate wherein the integrated circuit die has a mount height; attaching an attachment structure having a height substantially the same as the mount height and planar dimensions predetermined to fit adjacent the integrated circuit die and over the package substrate; and attaching a heat dissipation device over the integrated circuit die and the attachment structure.

20 Claims, 3 Drawing Sheets

INTEGRATED CIRCUIT PACKAGE SYSTEM WITH HEAT SINK SPACER STRUCTURES

CROSS-REFERENCE TO RELATED APPLICATION

This application claims the benefit of U.S. Provisional Patent Application Ser. No. 60/908,669 filed Mar. 28, 2007.

TECHNICAL FIELD

The present invention relates generally to integrated circuits and more particularly to a system for integrated circuit packages.

BACKGROUND ART

With virtually all electronic products, there has been a consistent if not increasing demand for new features, higher speed, more data, improved portability, etc. These demands have driven the development of electronic technology including reducing size, improving utility, or increasing performance of the integrated circuit devices contained within an ever-increasing range of electronic products such as cell phones, music players, televisions, or automobiles.

As electronic products have become an integral part of our daily lives, many electronic products with complex integrated circuits are commonly used often without end users' cognizance of the underlying electronic technology. Even for products that include obvious electronic technology, the technology itself is often taken for granted exacerbating the demands for improvements.

The conventional approach to heat removal from a die entails the use of a metal ring (known as a "stiffener") attached to the perimeter region of the package substrate to act as the landing area for a heat spreader or heat sink to be attached subsequently. The heat spreader or heat sink is either attached by means of adhesives or by mechanically bolting it with fasteners.

In either case, the "stiffener" provides a flat landing surface, which prevents tilting or "cocking" of the heat spreader of heat sink, which would lead to an unreliable package and also cause potential mechanical damage to the die. The stiffener consumes considerable functional area on the package substrate.

One proven way to reduce cost is to use mature package technologies with existing manufacturing methods and equipments. Paradoxically, the reuse of existing manufacturing processes does not typically result in the reduction of package dimensions. Existing packaging technologies struggle to cost effectively meet the ever-demanding thermal requirements of today's integrated circuits and packages.

Despite the advantages of recent developments in integrated circuit manufacturing, there is a continuing need for improving packages with heat sinks particularly for functional area utilization, fabrication costs, and compatibility with other package designs.

Thus, a need still remains for an integrated circuit package system providing low cost manufacturing, improved thermal performance, and reduce the integrated circuit package dimensions.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a package substrate; attaching an integrated circuit die over the package substrate wherein the integrated circuit die has a mount height; attaching an attachment structure having a height substantially the same as the mount height and planar dimensions predetermined to fit adjacent the integrated circuit die and over the package substrate; and attaching a heat dissipation device over the integrated circuit die and the attachment structure.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
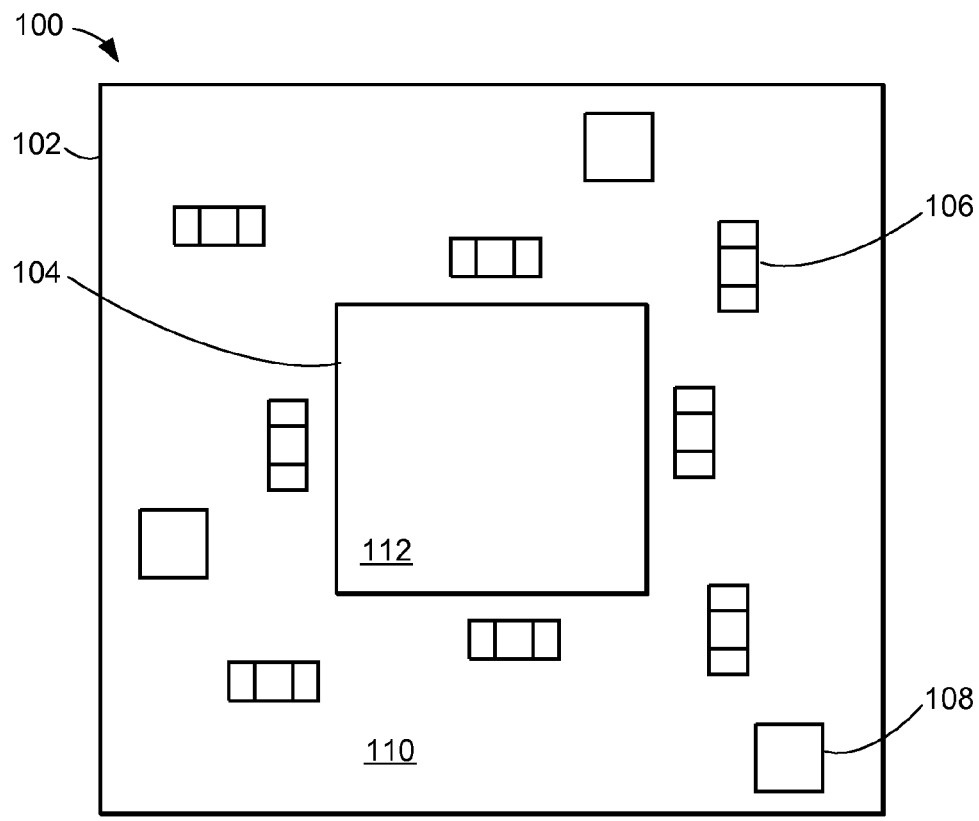
FIG. 1 is a top plan view of an integrated circuit package system in an attachment phase of a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a top plan view of an integrated circuit package system 100 in an attachment phase of a first embodiment of the present invention. The integrated circuit package system 100 preferably includes a package substrate 102, an integrated circuit die 104, devices 106 such as passive devices, and a plurality of attachment structures 108.

The plurality of attachment structures 108 can be formed of an insulator or a conductor such as metal or silicon (Si). Silicon provides advantageous manufacturing simplicity as well as properties of a semiconductor. The plurality of attachment structures 108 can be formed having substantially uniform height or thickness and planar dimensions predetermined to fit adjacent the integrated circuit die 104 or the devices 106 on exposed portions of the package substrate 102 not covered by the integrated circuit die 104 or devices 106.

For illustrative purposes, three of the attachment structures 108 are shown although it is understood that any number of the attachment structures 108 may be used. Three of the attachment structures 108 can provide mechanical stability although the quantity of the attachment structures 108 can also be based on application.

For example, an application requiring bolting of the attachment structures 108 could include four of the attachment structures 108. One of the attachment structures 108 could be placed in each of the four quadrants of the package substrate 102.

The attachment structures 108 can be located in any position over a package substrate attach surface 110 of the package substrate 102. The attachment structures 108 preferably provide a substantially fixed vertical dimension approximately equal to a mount height of the integrated circuit die 104. The integrated circuit die 104 can be mounted over the package substrate 102 having a mount height from the package substrate attach surface 110 to a die top surface 112.

The attachment structures 108 and the die top surface 112 can provide a substantially planar surface approximately parallel to a plane of the package substrate attach surface 110. The devices 106 can preferably be mounted having an upper extent below the substantially planar surface of the attachment structures 108 and the die top surface 112.

The devices 106 can be mounted over the package substrate 102 and adjacent the integrated circuit die 104. The integrated circuit die 104 and the devices 106 can be electrically connected to the package substrate 102 and optionally one to another. For illustrative purposes, several of the devices 106 are shown over the package substrate attach surface 110 although it is understood that the devices 106 are optional and any number can be used. At least one of the devices 106 is mounted between a corner of the package substrate 102 and at least one of the plurality of attachment structures 108, which are between the integrated circuit die 104 and an outer edge of the package substrate 102.

It has been discovered that the integrated circuit package system 100 having the attachment structures 108 improves functional area utilization, fabrication costs, and compatibility with any package design. Further, the integrated circuit package system 100 having the attachment structures 108 eliminates the need for a ring or stiffener resulting in improved free space available on the package substrate attach surface 110.

Figure 2:
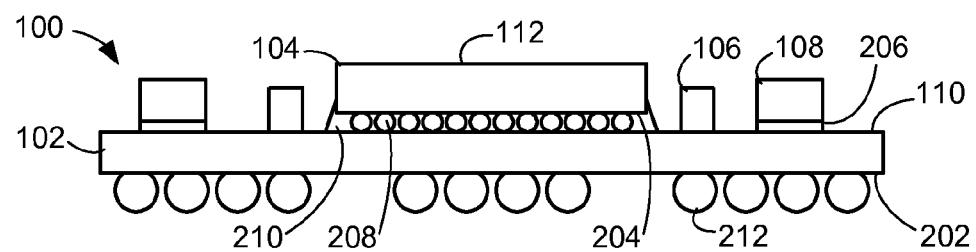
FIG. 2 is a side plan view of the structure of FIG. 1.

Referring now to FIG. 2 therein is shown a side plan view of the structure of FIG. 1. The integrated circuit package system 100 preferably includes the package substrate 102, the integrated circuit die 104, the devices 106 such as passive devices, and the attachment structures 108. The package substrate 102 includes the package substrate attach surface 110 and a package substrate external surface 202. The integrated circuit die 104 includes the die top surface 112 and a die mounting surface 204.

A structure attach material 206 can optionally be applied to the attachment structures 108 and the package substrate attach surface 110. The structure attach material 206 can provide an interface between the attachment structures 108 and the package substrate attach surface 110. The interface such as adhesion, insulation, thermal conduction, or electrical conduction can be predetermined based on the package or application. The interface can also be connected to a ground potential on the substrate.

The integrated circuit die 104 can include die connectors 208 for attachment to the package substrate attach surface 110. The die connectors 208 such as flip chip solder bumps can electrically connect the integrated circuit die 104 to the package substrate 102. A fill material 210 can optionally be applied to the die mounting surface 204, the die connectors 208, or the package substrate attach surface 110. The fill material 210 can provide support, structural integrity, or mounting adhesion to the integrated circuit die 104 and the package substrate 102.

The package substrate external surface 202 can include package connectors 212. The package connectors 212 provide electrical connectivity to a next level system such as another package, a printed circuit board, or a system connector. The integrated circuit die 104 or the devices 106 can electrically connect to the package substrate 102 through the package substrate attach surface 110 to the package substrate external surface 202 and thereby connect to the package connectors 212 and a next level system.

Figure 3:
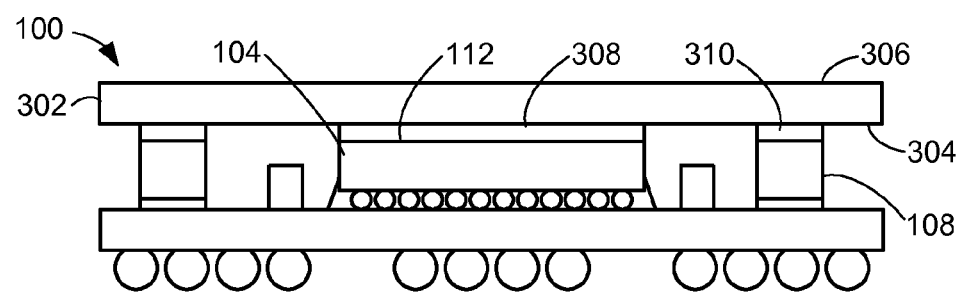
FIG. 3 is a side plan view of the structure of FIG. 2 in a mounting phase.

Referring now to FIG. 3, therein is shown a side plan view of the structure of FIG. 2 in a mounting phase. The integrated circuit package system 100 preferably includes a heat dissipation device 302 such as a heat spreader or a heat sink. The heat dissipation device 302 can include a dissipation device attach surface 304 and a dissipation device outer surface 306.

The heat dissipation device 302 can be mounted over the die top surface 112 of the integrated circuit die 104 and the attachment structures 108. Optionally, a first attach material 308 can be applied to the die top surface 112 and the dissipation device attach surface 304. The first attach material 308 can be insulating, conductive, adhesive, or fill.

Similarly a second attach material 310 can optionally be applied to the attachment structures 108 and the dissipation device attach surface 304. The second attach material 310 can also be insulating, conductive, adhesive, or fill. Further the second attach material 310 can be of the same or different material from the first attach material 308.

The dissipation device outer surface 306 can be substantially exposed to provide improved thermal transfer through the heat dissipation device 302. Thermal transfer through the heat dissipation device 302 can remove heat from the integrated circuit die 104, the devices 106, or the package substrate 102 to an ambient environment.

Optionally, the attachment structures 108 can be formed as solder balls soldered to the structure attach material 206. The heat dissipation device 302 can be attached having the dissipation device attach surface 304 on the attachment structures 108 formed as solder balls on the structure attach material 206.

Another option provides the attachment structures 108 formed as solder built up on the structure attach material 206. The heat dissipation device 302 can be attached having the dissipation device attach surface 304 on the attachment structures 108 formed as solder built up on the structure attach material 206.

Figure 4:
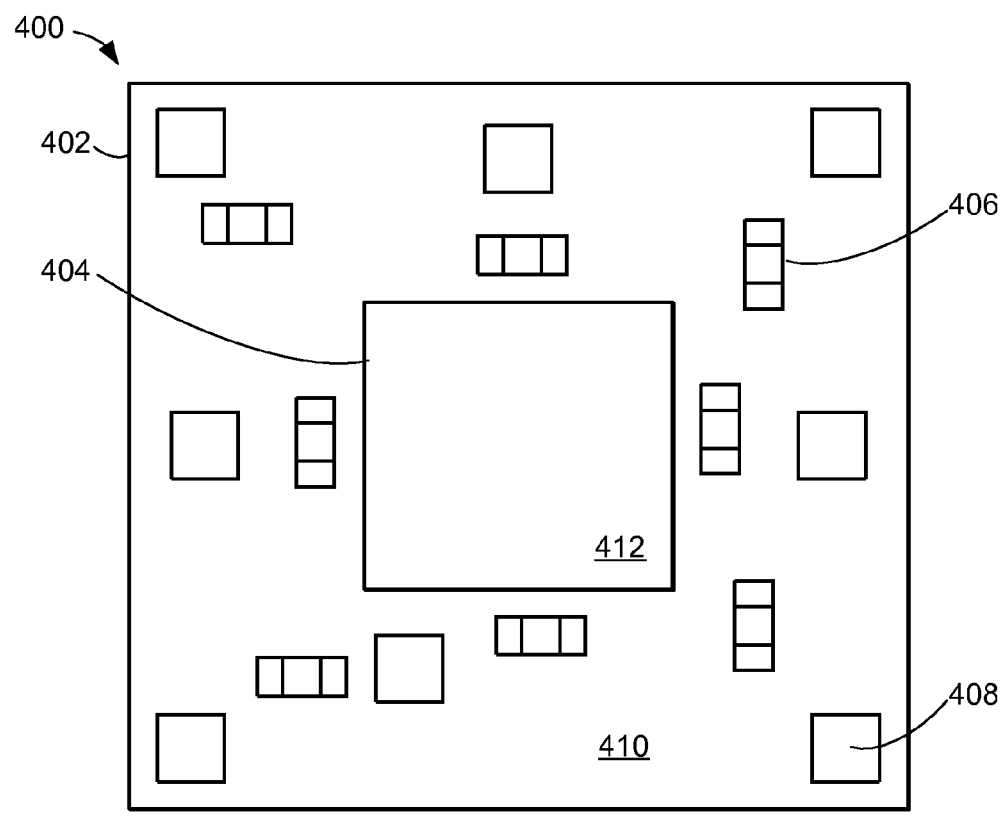
FIG. 4 is a top plan view of an integrated circuit package system in a second embodiment of the present invention.

Referring now to FIG. 4, therein is shown a top plan view of an integrated circuit package system 400 in a second embodiment of the present invention. The integrated circuit package system 400 preferably includes a package substrate 402, an integrated circuit die 404, devices 406 such as passive devices, and attachment structures 408.

The attachment structures 408 can be formed of an insulator or a conductor such as metal or silicon (Si). Silicon provides advantageous manufacturing simplicity as well as properties of a semiconductor. The attachment structures 408 can be formed having substantially uniform height or thickness and planar dimensions predetermined to fit adjacent the integrated circuit die 404 or the devices 406 on available area on the package substrate 402.

For illustrative purposes, eight of the attachment structures 408 are shown although it is understood that any number of the attachment structures 408 may be used. Eight of the attachment structures 408 can provide a corner configuration suitable for mechanical mounting although the quantity of the attachment structures 408 can also be based on application.

The attachment structures 408 can be located in any position over a package substrate attach surface 410 of the package substrate 402. The attachment structures 408 preferably provide a substantially fixed vertical dimension approximately equal to a mount height of the integrated circuit die 404. The integrated circuit die 404 can be mounted over the package substrate 402 having a mount height from the package substrate attach surface 410 to a die top surface 412.

The attachment structures 408 and the die top surface 412 can provide a substantially planar surface approximately parallel to a plane of the package substrate attach surface 410. The devices 406 can preferably be mounted having an upper extent below the substantially planar surface of the attachment structures 408 and the die top surface 412.

The devices 406 can be mounted over the package substrate 402 and adjacent the integrated circuit die 404. The integrated circuit die 404 and the devices 406 can be electrically connected to the package substrate 402 and optionally one to another. For illustrative purposes, several of the devices 406 are shown over the package substrate attach surface 410 although it is understood that the devices 406 are optional and any number can be used.

Figure 5:
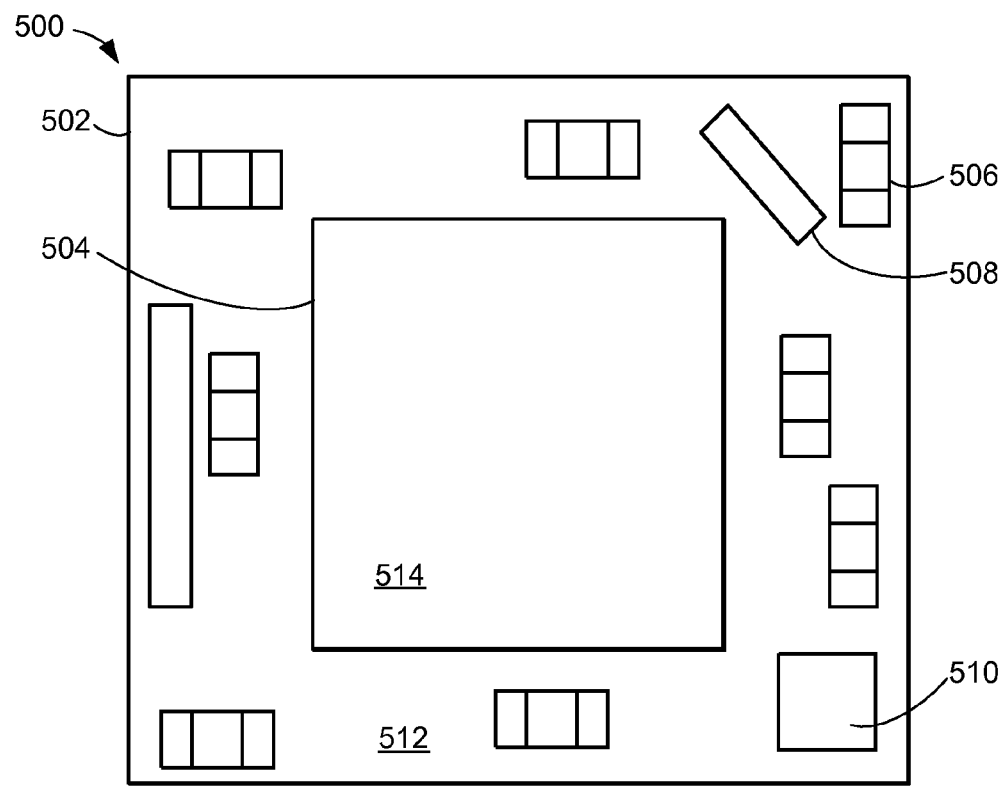
FIG. 5 is a top plan view of an integrated circuit package system in a third embodiment of the present invention.

Referring now to FIG. 5, therein is shown a top plan view of an integrated circuit package system 500 in a third embodiment of the present invention. The integrated circuit package system 500 preferably includes a package substrate 502, an integrated circuit die 504, devices 506 such as passive devices, elongated attachment structures 508, and a compact attachment structure 510.

The elongated attachment structures 508 and the compact attachment structure 510 can be formed of an insulator or a conductor such as metal or silicon (Si). Silicon provides advantageous manufacturing simplicity as well as properties of a semiconductor.

The elongated attachment structures 508 and the compact attachment structure 510 can be formed having substantially uniform height or thickness and planar dimensions predetermined to fit adjacent the integrated circuit die 504 or the devices 506 on available area on the package substrate 502.

Further, the elongated attachment structures 508 can optionally be attached with an angular placement or non-orthogonally. The angular placement can provide spacing for the elongated attachment structures 508 particularly with very narrow space designs or designs with underfill bleed or other keep-outs.

For illustrative purposes, two of the elongated attachment structures 508 and one of the compact attachment structure 510 are shown although it is understood that any number or combination of the elongated attachment structures 508 or the compact attachment structure 510 may be used.

The elongated attachment structures 508 or the compact attachment structure 510 can be located in any position over a package substrate attach surface 512 preferably providing a substantially fixed vertical dimension approximately equal to a mount height of the integrated circuit die 504. The integrated circuit die 504 can be mounted over the package substrate 502 having a mount height from the package substrate attach surface 512 to a die top surface 514.

The elongated attachment structures 508, the compact attachment structure 510, and the die top surface 514 can provide a substantially planar surface approximately parallel to a plane of the package substrate attach surface 512. The devices 506 can preferably be mounted having an upper extent below the substantially planar surface of the elongated attachment structures 508, the compact attachment structure 510, and the die top surface 514.

The devices 506 can be mounted over the package substrate 502 and adjacent the integrated circuit die 504. The integrated circuit die 504 and the devices 506 can be electrically connected to the package substrate 502 and optionally one to another. For illustrative purposes, several of the devices 506 are shown over the package substrate attach surface 512 although it is understood that the devices 506 are optional and any number can be used.

Figure 6:
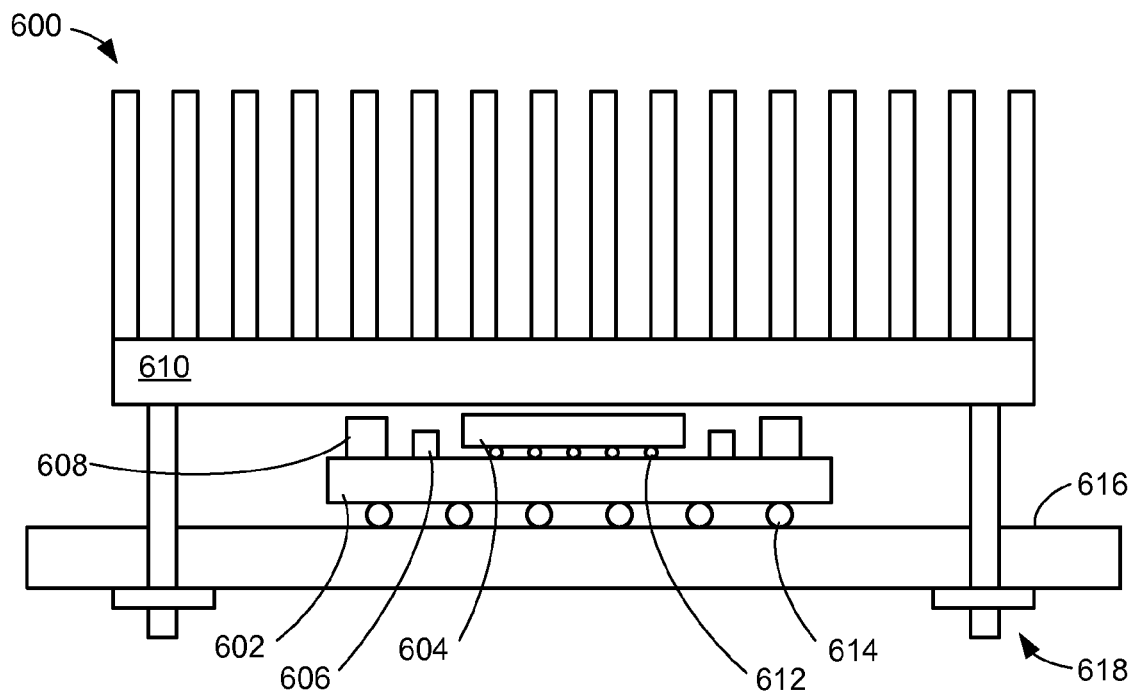
FIG. 6 is a side plan view of an integrated circuit package system in a fourth embodiment of the present invention.

Referring now to FIG. 6, therein is shown a side plan view of an integrated circuit package system 600 in a fourth embodiment of the present invention. The integrated circuit package system 600 preferably includes a package substrate 602, an integrated circuit die 604, devices 606 such as passive devices, attachment structures 608, and a heat dissipation device 610.

The integrated circuit die 604 can include die connectors 612 attached over the package substrate 602 adjacent the devices 606 and the attachment structures 608. The die connectors 612 such as flip chip solder bumps can electrically connect the integrated circuit die 604 to the package substrate 602.

The package substrate 602 can include can include package connectors 614 on a side of the package substrate 602 opposite the integrated circuit die 604. The package connectors 614 provide electrical connectivity to a next level system such as another package, a printed circuit board, or a system connector.

The package substrate 602 with the package connectors 614 can be mounted over a base substrate 616 such as a system board to provide electrical connectivity. The heat dissipation device 610 can be mounted over the integrated circuit die 604 and the attachment structures 608 to provide thermal control for the integrated circuit die 604 and the devices 606.

A clamping fixture 618 can apply force or pressure to clamp the heat dissipation device 610 over the integrated circuit die 604 and the attachment structures 608 as well as the base substrate 616 over the package connectors 614 of the package substrate 602. The force or pressure can be adjusted or predetermined based on the components or application.

The clamping fixture 618 can improve stability, structural integrity, or a substantially fixed position of the heat dissipation device 610. The clamping fixture 618 can also improve attachment of the heat dissipation device 610 particularly with processes requiring substantially uniform contact or extended curing time.

Figure 7:
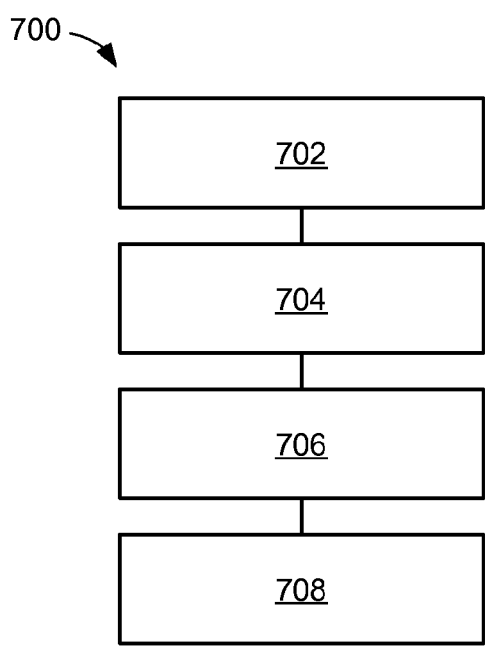
FIG. 7 is a flow chart of an integrated circuit package system for manufacturing the integrated circuit package system in an embodiment of the present invention.

Referring now to FIG. 7, therein is shown a flow chart of an integrated circuit package system 700 for manufacturing the integrated circuit package system 100 in an embodiment of the present invention. The system 700 includes providing a package substrate in a block 702; attaching an integrated circuit die over the package substrate wherein the integrated circuit die has a mount height in a block 704; attaching an attachment structure having a height substantially the same as the mount height and planar dimensions predetermined to fit adjacent the integrated circuit die and over the package substrate in a block 706; and attaching a heat dissipation device over the integrated circuit die and the attachment structure in a block 708.

In greater detail, a system to provide the method and apparatus of the integrated circuit package system 100, in an embodiment of the present invention, is performed as follows:

1. Forming a package substrate having a package substrate attach surface.
2. Mounting an integrated circuit die having a die top surface, a die mounting surface, and a mount height wherein the die mounting surface is over the package substrate attach surface.
3. Mounting an attachment structure having a height substantially the same as the mount height and planar dimensions predetermined to fit adjacent the integrated circuit die and over the package substrate attach surface.
4. Mounting a heat dissipation device over the die top surface and the attachment structure.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a package substrate;
   attaching an integrated circuit die over the package substrate forming an exposed surface of the package substrate wherein the integrated circuit die has a mount height;
   mounting a passive device on a side the package substrate having the integrated circuit die;
   attaching a plurality of attachment structures having a height substantially the same as the mount height and planar dimensions predetermined to fit on a plurality of portions of the exposed surface of the package substrate between the integrated circuit die and an outer edge of the package substrate, with the passive device between a corner of the package substrate and at least one of the plurality of attachment structures; and
   attaching a heat dissipation device over the integrated circuit die and the passive device using the plurality of attachment structures.

2. The method as claimed in claim 1 wherein attaching the heat dissipation device includes attaching the heat dissipation device to the integrated circuit die.

3. The method as claimed in claim 1 wherein attaching the plurality of attachment structures includes attaching an elongated attachment structure.

4. The method as claimed in claim 1 wherein attaching the plurality of attachment structures includes attaching at least one attachment structure near another corner of the package substrate.

5. The method as claimed in claim 1 wherein attaching the heat dissipation device includes attaching a clamping fixture to the heat dissipation device over the integrated circuit die and the attachment structures.

6. A method of manufacturing an integrated circuit package system comprising:
   forming a package substrate having a package substrate attach surface and an exposed substrate surface;
   attaching an integrated circuit die having a die top surface, a die mounting surface, and a mount height wherein the die mounting surface is over the package substrate attach surface;
   mounting a passive device on a side the package substrate having the integrated circuit die;
   attaching a plurality of attachment structures having a height substantially the same as the mount height and planar dimensions predetermined to fit adjacent the integrated circuit die and over the exposed substrate surface between the integrated circuit die and an outer edge of the package substrate, with the passive device between a corner of the package substrate and at least one of the plurality of attachment structures; and
   attaching a heat dissipation device over the die top surface and the passive device using the plurality of attachment structures.

7. The method as claimed in claim 6 wherein attaching the heat dissipation device includes attaching the heat dissipation device to the die top surface.

8. The method as claimed in claim 6 wherein attaching the plurality of attachment structures includes attaching an elongated attachment structure for narrow space designs, designs requiring underfill bleed or other keep-outs.

9. The method as claimed in claim 6 wherein attaching the plurality of attachment structures includes attaching at least one attachment structure near another corner of the package substrate for mechanical mounting applications.

10. The method as claimed in claim 6 wherein attaching the heat dissipation device includes applying force from a clamping fixture to the heat dissipation device and a base substrate.

11. An integrated circuit package system comprising:
a package substrate;
an integrated circuit die over the package substrate to form an exposed surface of the package substrate wherein the integrated circuit die has a mount height;
a passive device on a side the package substrate having the integrated circuit die;
a plurality of attachment structures having a height substantially the same as the mount height and planar dimension's predetermined to fit on a plurality of portions of the exposed surface of the package substrate adjacent the integrated circuit die and over the package substrate between the integrated circuit die and an outer edge of the package substrate, with the passive device between a corner of the package substrate and at least one of the plurality of attachment structures; and
a heat dissipation device over the integrated circuit die and the passive device using the plurality of attachment structures.

12. The system as claimed in claim 11 wherein the heat dissipation device is attached to the integrated circuit die.

13. The system as claimed in claim 11 wherein at least one of the attachment structures is an elongated attachment structure.

14. The system as claimed in claim 11 wherein at least one of the plurality of attachment structures is near another corner of the package substrate.

15. The system as claimed in claim 11 wherein the heat dissipation device includes a clamping fixture attached to the heat dissipation device over the integrated circuit die and the plurality of attachment structures.

16. The system as claimed in claim 11 wherein:
the package substrate has a package substrate attach surface;
the integrated circuit has a die top surface, a die mounting surface, and a mount height wherein the die mounting surface is over the package substrate attach surface;
the plurality of attachment structures has a height substantially the same as the mount height and planar dimensions predetermined to fit adjacent the integrated circuit die and over portions of the exposed surface of the package substrate; and
the heat dissipation device is over the die top surface and the plurality of attachment structures.

17. The system as claimed in claim 16 wherein the heat dissipation device is attached to the die top surface.

18. The system as claimed in claim 16 wherein at least one of the plurality of attachment structures is an elongated attachment structure for narrow space designs, designs requiring underfill bleed or other keep-outs.

19. The system as claimed in claim 16 wherein at least one of the plurality of attachment structures is near another corner of the package substrate for mechanical mounting applications.

20. The system as claimed in claim 16 wherein the heat dissipation device includes a clamping fixture applied to the heat dissipation device and a base substrate.

\* \* \* \* \*

UNITED STATES PATENT AND TRADEMARK OFFICE
CERTIFICATE OF CORRECTION

| | |
|---|---|
| PATENT NO. | : 8,212,352 B2 |
| APPLICATION NO. | : 12/050797 |
| DATED | : July 3, 2012 |
| INVENTOR(S) | : Pendse |

It is certified that error appears in the above-identified patent and that said Letters Patent is hereby corrected as shown below:

In the Claims:

Column 9, line 13, delete "dimension's predetermined"
and insert therefor --dimensions predetermined--

Signed and Sealed this
Third Day of November, 2015

Michelle K. Lee
*Director of the United States Patent and Trademark Office*